United States Patent
Banba et al.

(10) Patent No.: US 6,498,761 B2
(45) Date of Patent: Dec. 24, 2002

(54) POWER SUPPLY CIRCUIT AND SEMICONDUCTOR MEMORY DEVICE HAVING THE SAME

(75) Inventors: Hironori Banba, Kamakura (JP); Shigeru Atsumi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/983,258

(22) Filed: Oct. 23, 2001

(65) Prior Publication Data

US 2002/0021611 A1 Feb. 21, 2002

Related U.S. Application Data

(60) Continuation of application No. 09/640,370, filed on Aug. 17, 2000, now Pat. No. 6,356,499, which is a division of application No. 09/030,914, filed on Feb. 26, 1998, now Pat. No. 6,128,242.

(30) Foreign Application Priority Data

Feb. 27, 1997 (JP) .............................. 9-044011
Feb. 27, 1997 (JP) .............................. 9-044175

(51) Int. Cl.$^7$ ................................. G11C 7/00
(52) U.S. Cl. ............. 365/226; 365/185.18; 365/189.09; 365/189.11
(58) Field of Search ....................... 365/185.18, 185.33, 365/189.09, 189.11, 226

(56) References Cited

U.S. PATENT DOCUMENTS

| | | |
|---|---|---|
| 5,216,558 A | 6/1993 | Bajwa et al. |
| 5,337,284 A | 8/1994 | Cordoba et al. |
| 5,553,030 A | 9/1996 | Tedrow et al. |
| 5,650,741 A | 7/1997 | Nakamura et al. |
| 5,671,179 A | 9/1997 | Javanifard |
| 5,740,113 A | 4/1998 | Kaneko |
| 5,844,404 A | 12/1998 | Caser et al. |
| 5,867,442 A | 2/1999 | Kim et al. |
| 5,875,129 A * | 2/1999 | Atsumi et al. ......... 365/185.23 |
| 5,936,459 A | 8/1999 | Hamamoto |
| 5,969,565 A | 10/1999 | Nagamawa |
| 5,999,475 A | 12/1999 | Futatsuya et al. |

FOREIGN PATENT DOCUMENTS

JP    08-287677 A    11/1996

OTHER PUBLICATIONS

D. Ito, "Very Large Scale Integrated Memory," published by Bairfukan, 1994, p. 264.

* cited by examiner

Primary Examiner—Richard Elms
Assistant Examiner—Van Thu Nguyen
(74) Attorney, Agent, or Firm—Banner & Witcoff, Ltd.

(57) ABSTRACT

A number of booster circuits to be operated out of a plurality of booster circuits are selected in accordance with a level of the boosted voltage to be provided at a common voltage output terminal of the plurality of booster circuits. With such an arrangement, fluctuations in the output voltage that can appear when a light load is applied to the voltage output terminal of the booster circuits can be effectively reduced to make the semiconductor memory device driven by the power supply circuit operate reliably. Further, one of the output terminals of intermediate voltage booster circuits is connected to the output terminal of a high voltage booster circuit. Then, a desired voltage can be obtained from the booster circuits that are implemented without using costly transistors to reduce the chip cost.

5 Claims, 9 Drawing Sheets

FIG. 9
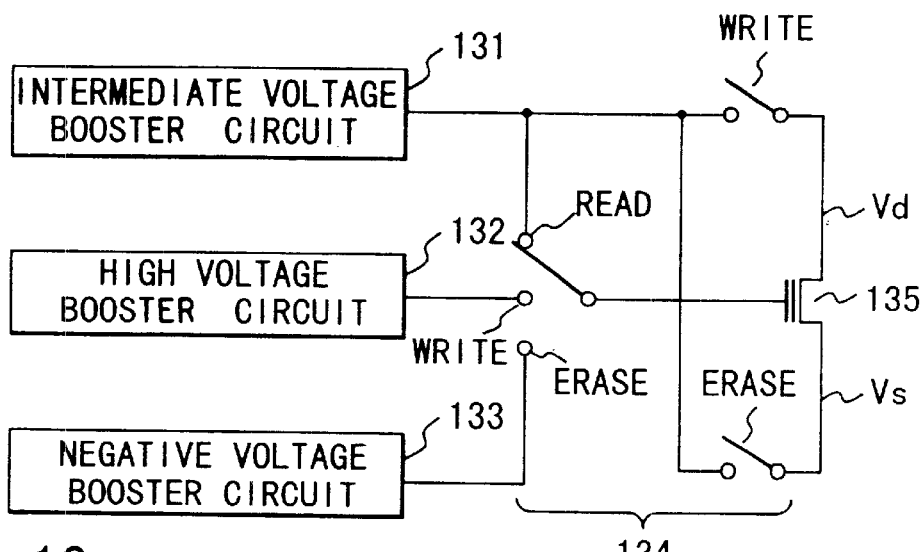
FIG. 10
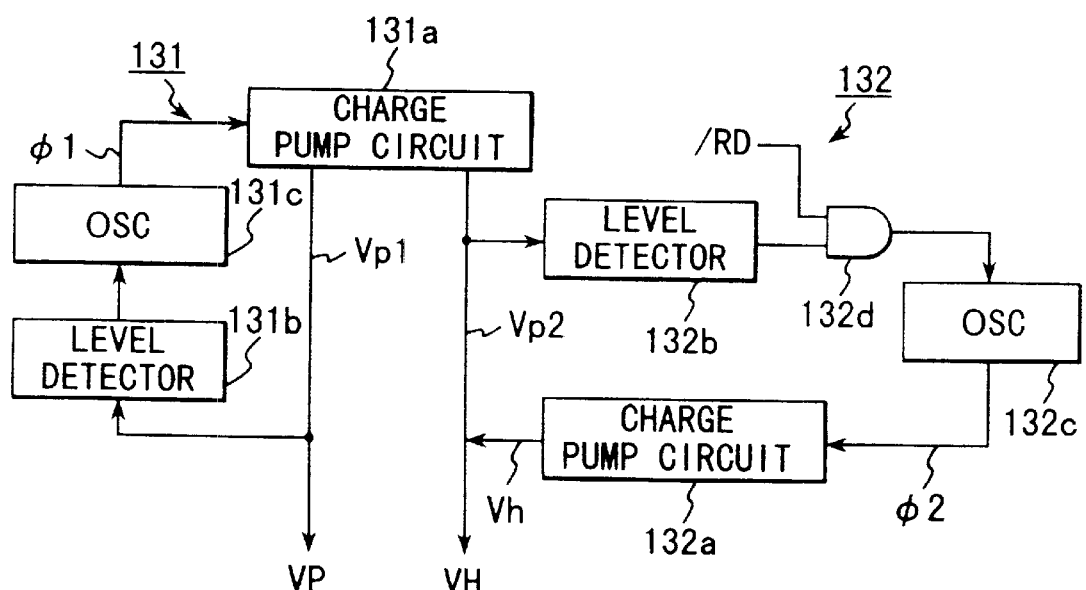
FIG. 11

POWER SUPPLY CIRCUIT AND SEMICONDUCTOR MEMORY DEVICE HAVING THE SAME

CROSS REFERENCE TO RELATED APPLICATIONS

This application is a continuation of U.S. Ser. No. 09/640,370, filed Aug. 17, 2000 now U.S. Pat. No. 6,356,499 which is a divisional of U.S. Ser. No. 09/030,914, filed Feb. 26, 1998 (now U.S. Pat. No. 6,128,242) which claims priority under 35 U.S.C. § 119 to Japanese Patent Application Nos. 9-044011, filed Feb. 27, 1997 and 9-044175, filed Feb. 27, 1997, the entire contents of which are incorporated herein by reference.

BACKGROUND OF THE INVENTION

The present invention relates to a power supply circuit and a semiconductor memory device having such a power supply circuit, and more particularly to a single-source type power supply circuit including a booster circuit and a non-volatile semiconductor memory device having such a power supply circuit.

FIG. 1 is a schematic circuit diagram of a typical booster circuit to be used for a power supply circuit.

The booster circuit includes diodes D1 through D6, capacitors C1 through C5 and capacitor Ca, and inverters G1, G2.

The anode of the diode D1 is supplied with external supply voltage Vcc. The cathodes of the diodes D1 through D5 are respectively connected to the anodes of the diodes D2 through D6 and the anodes of the diodes D2 through D6 are also connected to the first terminals of the capacitors C1 through C5 respectively. The other ends of the capacitors C1, C3 and C5 are connected to the output terminal of inverter G1 whose input terminal is fed with clock signal OSC generated by an oscillator. The input terminal of the inverter G1 operates as the signal input terminal of the booster circuit. The other ends of the capacitors C2 and C4 are fed with clock signal OSC. The cathode of the diode D6 outputs voltage Vccint. A stabilizing capacitor Ca is connected between the cathode of the diode D6 and ground.

Electric charges are transferred from diode to diode in an alternating manner in the booster circuit in accordance with clock signal OSC fed from an oscillator. As a result, it generates voltage Vccint that is higher than external supply voltage Vcc.

FIG. 2 is a schematic circuit diagram of a typical oscillator to be used for a power supply circuit.

The first input terminal of NAND-gate 1 is fed with signal CPE for enabling the booster circuit. The output terminal of the NAND-gate 1 is connected to, for example, a 4-stage inverter 2 including four serially connected inverters. The output signal of the 4-stage inverter 2 is fed to the second input terminal of the NAND-gate 1. For example, an inverted signal of the output signal of the inverter 2 is used as clock signal OSC.

When signal CPE rises to a high level, the oscillator outputs a clock signal OSC that alternately rises to a high level and falls to a low level. When signal CPE goes to a low level, the oscillator stops oscillating and outputs a low level signal.

FIG. 3 is a circuit diagram of a known power supply circuit including a booster circuit as shown in FIG. 1 and an oscillator as shown in FIG. 2. The power supply circuit provides a booster circuit system typically used for a non-volatile semiconductor memory device.

The oscillator 12 and the booster circuit 13 have respective circuit configurations identical with those illustrated in FIGS. 2 and 1. The output voltage Vccint of the booster circuit 13 is divided by resistor 17 and supplied to the inverted input terminal of a differential amplifier 11. The non-inverted input terminal of the differential amplifier 11 is supplied with reference voltage Vref. The differential amplifier 11 supplies signal CPE to the oscillator 12.

The differential amplifier 11 compares the reference Voltage Vref and the voltage obtained by regulating the voltage Vccint and turns on/off the booster circuit 13 in accordance with the outcome of the comparison. In this way, the output voltage (boosted voltage) Vccint of the booster circuit 13 is held to a desired level that may be, for example, equal to 10V.

As shown in FIG. 3, the output voltage Vccint of the booster circuit 13 is supplied to regulator circuit 14 and Y-selector 16.

For example, the regulator circuit 14 may generate a voltage of 6.5V in the write (program) verify mode of operation, and a voltage of 10V which is equal to the output voltage Vccint in the write (program) mode. Likewise, it may generate a voltage of 2.5V in the erase mode, and a voltage of 3.5V in the erase verify mode.

The output voltage Vout of the regulator circuit 14 is supplied to row decoder 15. The row decoder 15 selects a word line of a memory cell array (not shown) in accordance with a row select signal.

The Y-selector 16 selects a bit line of the memory cell array (not shown) in accordance with a column select signal.

The output voltage Vccint of the booster circuit 13 is subjected to a variety of loads.

Firstly, the capacitance of the Y-selector 16 itself provides a load.

Additionally, in the write (program) mode, the regulator circuit 14 directly applies the obtained voltage Vccint to the row decoder 15. Accordingly, the capacitance 18 of the word line (which is selected by the row decoder 15 and to which the output voltage Vccint of the booster circuit 13 is directly supplied) makes a load for the voltage output terminal of the booster circuit 13. On the other hand, in the erase mode, the write verify mode or the erase verify mode, the output voltage Vccint of the booster circuit 13 is shifted to a lower voltage by the regulator circuit 14 and, therefore, the capacitance 18 of the word line does not make any load. Therefore, the load to be added to the voltage Vccint varies depending on the mode of operation.

FIGS. 4A and 4B show operating waveforms of the power supply circuit, or waveforms of the output voltage Vccint that may appear when the booster circuit 13 of the power supply circuit in FIG. 3 starts operating and the output voltage Vccint rises from 0V to 10V.

FIG. 4A shows a waveform of the output voltage Vccint that may be observed when there is a heavy load typically in the write (program) mode, whereas FIG. 4B shows a waveform of the output voltage Vccint that may appear when there is only a light load typically in the erase mode.

In the case of a light load as shown in FIG. 4B, the voltage Vccint overshoots to show a zig-zag waveform because of the light load and makes it difficult to output a well controlled stable voltage Vccint. When an overshot voltage Vccint is supplied from the power supply circuit to a device the circuit drives, it may exceed the withstand voltage level of the device and hence can degrade the performance of the device and damage its reliability.

In view of these problems, therefore, it is highly desirable to reduce the fluctuations in the output voltage of a power supply circuit that appear when a light load is applied to the voltage output terminal of the booster circuit and make it possible to provide a well controlled voltage from the booster circuit. Thus, there is a strong demand for a power supply circuit that can improve the reliability of any device it drives and also for a semiconductor memory device having such a power supply circuit.

Meanwhile, known non-volatile semiconductor memory devices include flash EEPROMs. A flash EEPROM includes stacked transistors having a floating gate and a control gate as memory cells. Such a memory cell changes its threshold voltage for data writing/erasing operations as electrons are charged into and discharged from it through the floating gate.

Flash memories adapted to be charged with hot electrons for data writing are currently driven either by a two-source type power supply circuit that uses a power supply of Vcc=5V for data writing and another power supply of Vpp=12V for data erasing, or by a single-source type power supply circuit that uses only a power supply of Vcc=5V. When a single-source type power supply circuit is used, power supply voltage Vpp for data erasing is obtained by means of a booster circuit.

The trend in recent years is in favor of power saving low voltage power supply circuits and 3V is typically used as power supply voltage. From the viewpoint of convenience, a single-source type power supply circuit may be superior to a two-source type power supply circuit.

Now, when the power supply voltage of a known power supply circuit adapted to supply the voltage directly to the control gate in the read mode is reduced from 5V to 3V, then the voltage supplied to the control gate also falls to 3V, resulting in reduction of the current flowing to the memory cells. A reduced cell current gives rise to a reduced reading speed and a reduced margin relative to the power supply voltage. In other words, with such a circuit, the voltage for data reading and the voltage for data writing and erasing have to be generated internally.

However, when a power supply voltage is used, a plurality of booster circuits may have to be employed to generate a voltage required within the chip and a number of different voltage levels have to be selectively used by means of a switching circuit to provide voltages necessary for reading, writing and erasing data respectively. Then, such a switching circuit is required to supply the generated voltage to the destination such as a control gate of memory cells without lowering it. Known control circuits of the type under consideration typically include depletion type transistors to prevent the generated voltage from falling by the threshold voltage of the transistors. However, the use of depletion type transistors is accompanied by a problem of an increased number of manufacturing steps and a high chip cost.

In view of the above circumstances, there is a strong demand for a power supply circuit that can provide any desired voltage from its booster circuit to reduce the chip cost and also for a semiconductor memory device having such a power supply circuit.

BRIEF SUMMARY OF THE INVENTION

Accordingly, it is an object of the present invention to provide a power supply circuit adapted to supply a desired voltage from its booster circuits in a highly controlled manner by reducing fluctuations in the output voltage that can appear when a light load is applied to the voltage output terminal of its booster circuits in order to improve the reliability of the device driven by the circuit and also a semiconductor memory device having such a power supply circuit.

It is another object of the present invention to provide a power supply circuit adapted to supply a desired voltage from its booster circuits 13 without using costly transistors in order to reduce the chip cost and also a semiconductor memory device having such a power supply circuit.

According to one aspect of the present invention, there is provided a power supply circuit comprising: a plurality of booster circuits, each being adapted to generate a boosted voltage in accordance with a clock signal and supply it to a common voltage output terminal; and a control circuit for selecting a number of booster circuits to be operated out of the plurality of booster circuits in accordance with a level of the boosted voltage to be provided at the common voltage output terminal.

According to another aspect of the present invention, there is provided a non-volatile semiconductor memory device comprising: a memory cell array having a plurality of non-volatile memory cells; and a power supply circuit for preparing a predetermined boosted voltage to be used for generating at least one of various voltages supplied to the non-volatile memory cells in write and erase modes, the power supply circuit including: a plurality of booster circuits, each being adapted to generate the boosted voltage in accordance with a clock signal and supply it to a common voltage output terminal, and a control circuit for selecting a number of booster circuits to be operated out of the plurality of booster circuits in accordance with a level of the boosted voltage to be provided at the common voltage output terminal.

According to another aspect of the present invention, there is provided a non-volatile semiconductor memory device comprising: a memory cell array having a plurality of non-volatile memory cells; a write/erase circuit for the plurality of non-volatile memory cells; and a circuit for generating desired voltages which are different from an external power supply voltage and applied to the plurality of non-volatile memory cells, the circuit including a booster circuit for generating a boosted voltage, wherein a power of the booster circuit is set higher in a write mode and is set lower in an erase mode when the boosted voltage of the booster circuit falls below a predetermined voltage.

According to a further aspect of the present invention, there is provided a semiconductor memory device comprising: a first booster circuit having first and second output terminals, for outputting a first voltage obtained by boosting a power supply voltage from the first and second output terminals; and a second booster circuit having an output terminal connected to the second output terminal of the first booster circuit, for outputting a second voltage higher than the first voltage by boosting the power supply voltage, the first voltage being supplied to the output terminal of the second booster circuit even when the second booster circuit stops its voltage boosting operation.

According to another aspect of the present invention, there is provided a semiconductor memory device comprising: a first booster circuit for outputting a first boosted voltage obtained by boosting a power supply voltage; a second booster circuit for outputting a second boosted voltage higher than the first boosted voltage by boosting the power supply voltage; a regulator circuit for regulating the second boosted voltage output from the second booster circuit to generate a regulated voltage; a transistor having a current path with an end applied with a voltage from the first booster circuit in a write or erase mode and the other end connected to an end of a current path of a memory cell; and a circuit for shifting a level of a signal to a gate of the transistor supplied to a level of the regulated voltage output from the regulator circuit.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of present invention and, together with the general description given above and the detailed description of the preferred embodiments given below, serve to explain the principles of the present invention in which:

FIG. 9 is a chart showing exemplary operating voltages of memory cells that can be used in a third embodiment of the present invention;

FIG. 10 is a schematic block diagram of a power supply circuit providing the voltages of FIG. 9;

FIG. 11 is a schematic block diagram of a concrete example of the power supply circuit providing the voltages of FIG. 9;

DETAILED DESCRIPTION OF THE INVENTION

Preferred embodiments of the present invention will now be described with reference to the accompanying drawings.

Figure 4A:
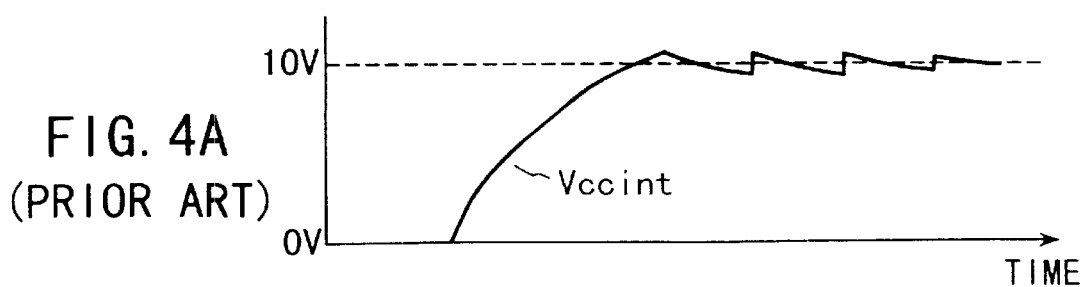
FIGS. 4A and 4B are graphs showing two different waveforms observed in the operation of a power supply circuit shown in FIG. 3.
Figure 4B:
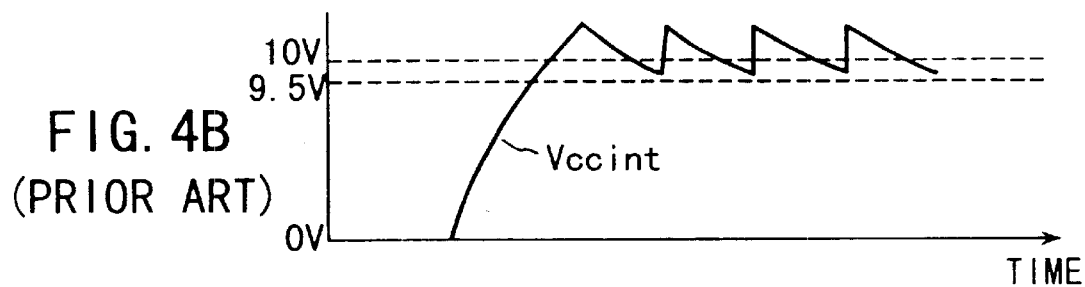
Figure 5:
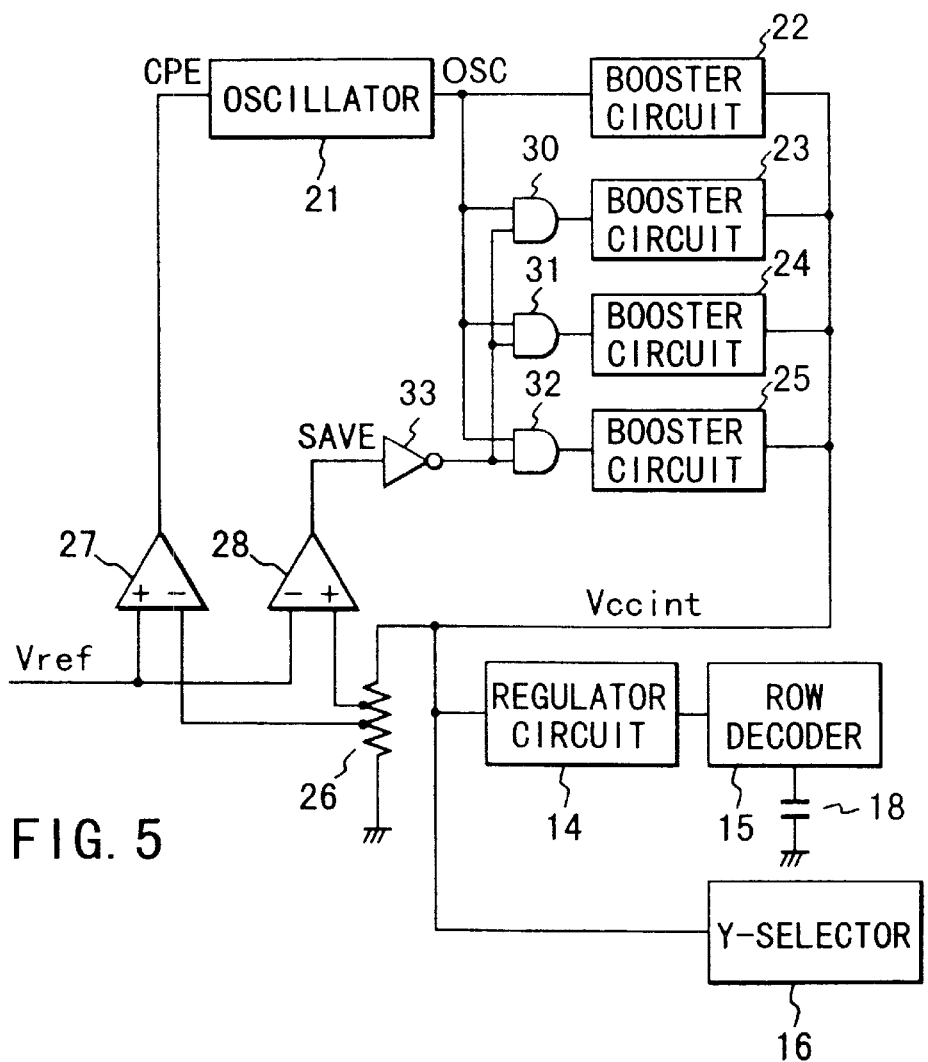
FIG. 5 is a schematic block diagram of a power supply circuit according to a first embodiment of the present invention.

FIG. 5 is a schematic block diagram of a power supply circuit according to a first embodiment of the present invention. Note that, in the following description, the components that are the same or similar to those of the prior art circuits illustrated in FIGS. 1 through 4 are denoted respectively by the same reference symbols and will not be described any further.

Figure 1:
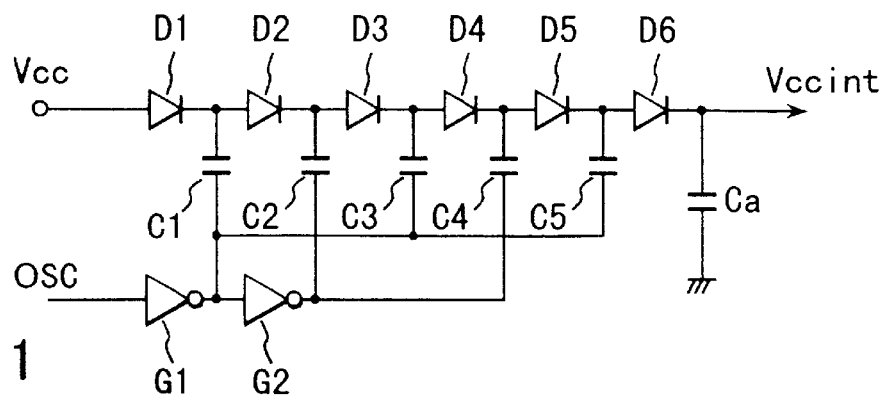
FIG. 1 is a schematic circuit diagram of a typical booster circuit to be used in a power supply circuit.
Figure 2:
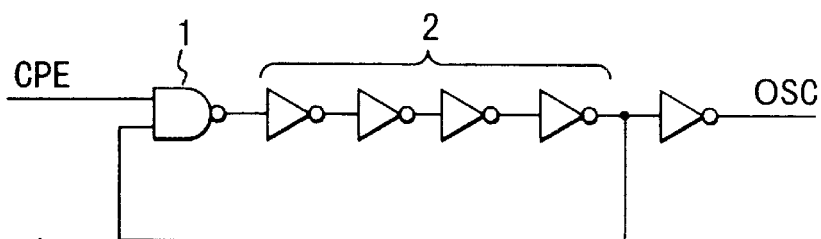
FIG. 2 is a schematic circuit diagram of a typical oscillator to be used in a power supply circuit.

Referring to the diagram of FIG. 5, oscillator 21 is identical with the one illustrated in FIG. 2 and generates clock signal OSC.

Figure 3:
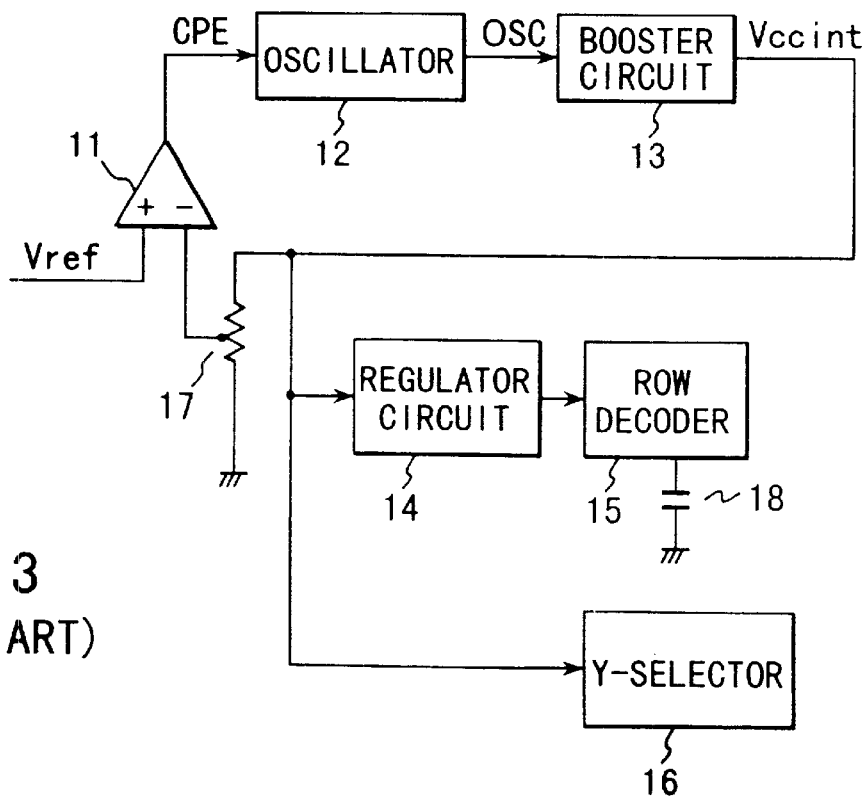
FIG. 3 is a schematic block diagram of a known power supply circuit including a booster circuit shown in FIG. 1 and an oscillator shown in FIG. 2.

While booster circuits 22 through 25 are similar to those illustrated in FIG. 2, the power of each of them is reduced from that of the booster circuit 13 of FIG. 3. A total of four booster circuits are arranged in the embodiment and the power of each of them is selected to be equal to a quarter of that of the prior art booster circuit of FIG. 3.

The term "power" of a booster circuit as used herein refers to the quantity of electricity supplied to the output terminal. The power of each booster circuit can be reduced by reducing the capacitance of the capacitors of the circuit and/or the number of boosting stages which is equal to the number of diodes of the circuit.

The voltage output terminals of the booster circuits 22 through 25 are mutually connected and the voltage of the point of connection (boosted voltage) is expressed by Vccint. The voltage Vccint is then supplied to regulator circuit 14 and Y-selector 16 as in the case of the prior art circuit.

The voltage Vccint is then divided and regulated by means of resistor 26 before being supplied to the inverted input terminal of differential amplifier 27 and the non-inverted input terminal of differential amplifier 28. Note that the voltage supplied to the differential amplifier 28 is made higher than the voltage supplied to the differential amplifier 27.

The non-inverted input terminal of the differential amplifier 27 and the inverted input terminal of the differential amplifier 28 are supplied with reference voltage Vref. The output terminal of the differential amplifier 27 outputs charge pump enable signal CPE. Signal CPE is then fed to oscillator 21 to control the latter as in the case of the prior art circuit.

The output terminal of the differential amplifier 28 outputs signal SAVE. Signal SAVE is then fed to the input terminal of inverter 33, the output terminal of inverter 33 is connected to the second input terminals of AND-gates 30, 31 and 32. The first input terminals of the AND-gates 30, 31, and 32 are fed with clock signal OSC generated by the oscillator 21. The output terminals of the AND-gates 30, 31 and 32 are connected respectively to the signal input terminals of the booster circuits 23, 24 and 25.

Assume here, for example, the voltage Vccint is set to 10V while the load is light as in the write verify mode shown in FIG. 4B and its waveform fluctuates in a zig-zag manner when it exceeds 9.5V. Then, the circuit regulates the voltage dividing operation of the resistor 26 so as to raise the signal SAVE from a low level to a high level when the voltage Vccint goes above 9.5V and lower the clock signal CPE from a high level to a low level when the voltage Vccint exceeds 10V.

Figure 6:
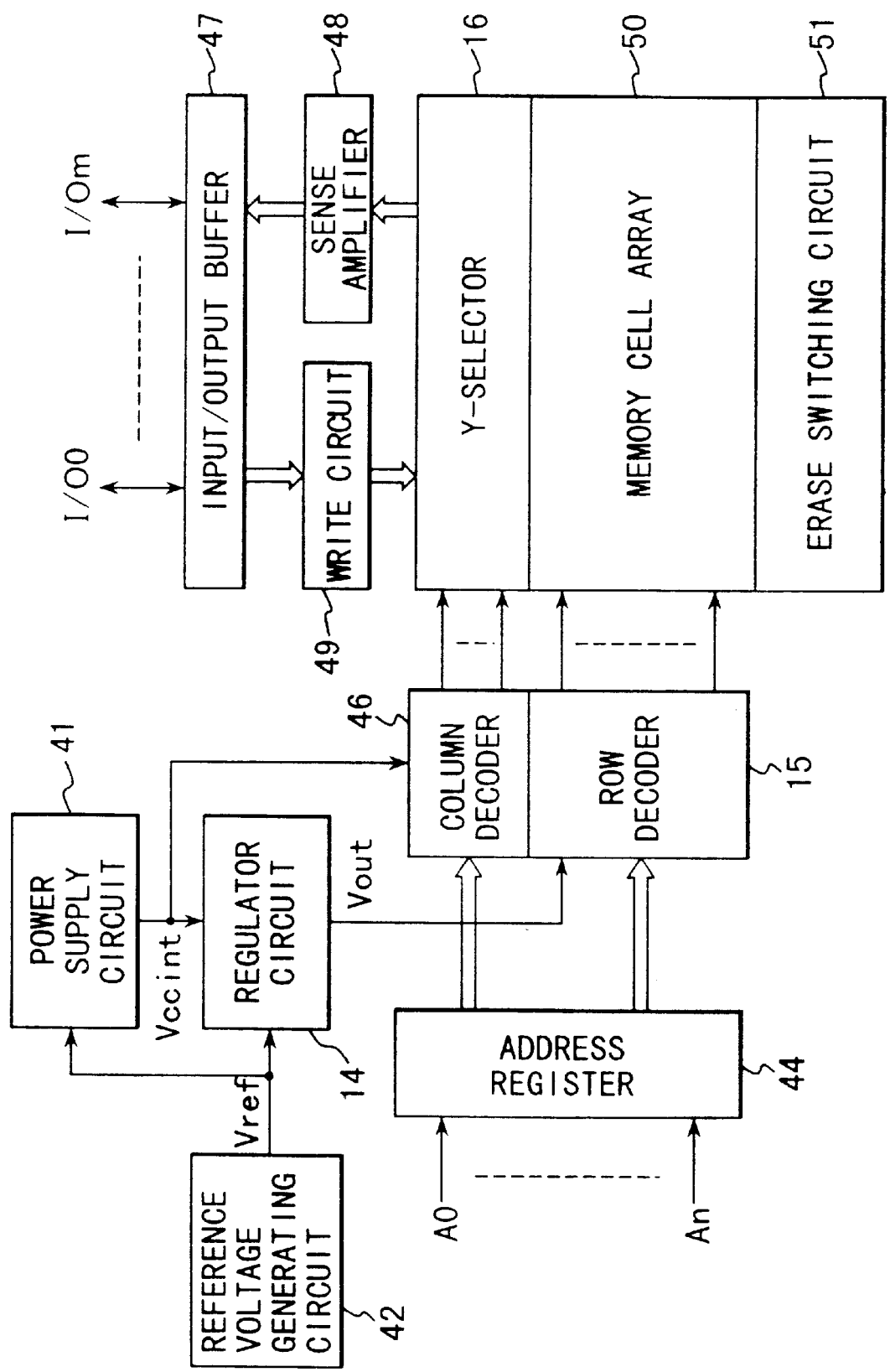
FIG. 6 is a schematic block diagram of a non-volatile semiconductor memory device having the power supply circuit shown in FIG. 5.

FIG. 6 is a schematic block diagram of a non-volatile semiconductor memory device having a power supply circuit shown in FIG. 5.

The power supply circuit 41 of. FIG. 6 corresponds to the power supply circuit of FIG. 5 and generates a boosted voltage of Vccint.

Reference voltage generating circuit 42 generates reference voltage Vref Regulator circuit 14 generates a predetermined output voltage Vout based on the reference voltage Vref, in accordance with a mode of operation that may be the write mode, the erase mode, the write verify mode or the read verify mode.

Internal address signals (or external address signals) AO through An are fed to row decoder 15 and column decoder 46 by way of address register 44. The output voltage Vout of the regulator circuit 14 is applied to a predetermined word line selected by the address signals AO through An by way of the row decoder 15.

In the write (program) mode, data are fed to predetermined memory cells of memory cell array 50 by way of input/output buffer 47, write circuit 49 and Y-selector 16.

In the read mode, data are used for verification by way of the Y-selector 16 and sense amplifier 48 or output to an external chip further by way of the input/output buffer 47.

In the erase mode, the voltage applied to the sources of the memory cells is switched by erase switching circuit 51.

Now, the operation of the power supply circuit of FIG. 5 will be described.

Assume that the booster circuits start operating and the voltage Vccint is raised from 0V to 10V. When the voltage Vccint is between 0V and 9.5V, charge pump enable signal CPE is at a high level and signal SAVE is at a low level. Therefore, clock signal OSC is fed to the signal input terminals of the booster circuits 22 through 25 to make all of them perform a voltage boosting operation.

When the voltage Vccint exceeds 9.5V, signal SAVE goes up to a high level while charge signal CPE remains at a high level. Therefore, the booster circuits 24 and 25 stop operating, leaving only the booster circuit 22 in the operating condition. Thus, the power of the booster circuits 22 through 25 falls as a whole.

Thereafter, as in above described prior art circuit, the oscillator is turned off when the voltage Vccint exceeds 10V and turned on when voltage Vccint falls under 10V to make the voltage Vccint stick to the level of 10V. It will be appreciated that the overshooting of this circuit is remarkably reduced if compared with the prior art circuit because the power of the booster circuits is reduced as a whole.

Assume now that the voltage Vccint is at a level of about 10V initially. As the voltage Vccint exceeds 10V, signal SAVE goes to a high level while signal CPE remains at a low level so that the oscillator is turned off to inactivate all the booster circuits. When, on the other hand, the voltage Vccint falls below 10V, both signals SAVE and CPE are moved up to a high level to make only the booster circuit 22 operate. However, when the voltage Vccint falls further to go below 9.5V, signal SAVE goes down to a low level to cause all the booster circuits 22 through 25 to operate.

Figure 7A:
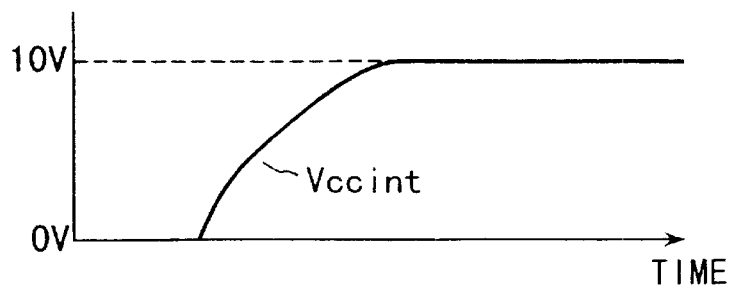
FIGS. 7A and 7B are graphs showing two different waveforms observed in the operation of the power supply circuit of FIG. 5.
Figure 7B:
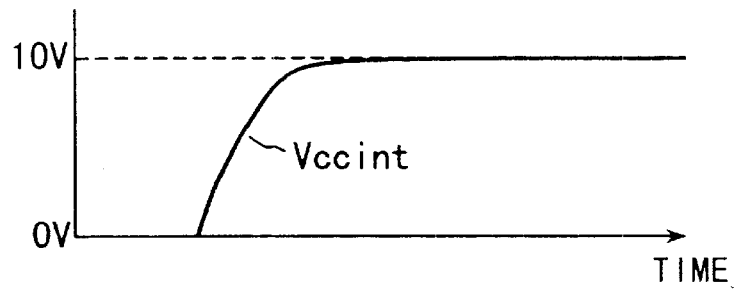

FIGS. 7A and 7B are graphs showing two different waveforms observed in the operation of the power supply circuit of FIG. 5.

FIG. 7A shows the waveform of the voltage Vccint when the load is heavy as in the write mode, whereas FIG. 7B shows the waveform of the voltage Vccint when the load is light as in the erase mode. It will be appreciated that, unlike the waveforms of the prior art circuit as described earlier, the waveform does not fluctuate in a zig-zag manner when the load is light as in the erase mode, the erase verify mode or the write verify mode so that the voltage is under strict control. It will also be appreciated that there occurs practically no overshooting and the voltage Vccint does not exceed the withstand voltage of the device driven by the power supply circuit to remarkably improve the reliability of the device.

While the power of the booster circuits is equal to a quarter of the combined power of all the booster circuits when they are operated only partly in the above described arrangement, the present invention is not limited thereto. The only requirement for the booster circuits to meet is to make the power of the operating booster circuit(s) equal to a level between one tenth and a half of the combined power of all the booster circuits. If the power is less than one tenth, it will take an excessively long time before getting to a desire boosted voltage to make the power supply circuit operate inefficiently. If, on the other hand, the power exceeds a half, the overshooting would not be reduced satisfactorily to make the power supply circuit ineffective.

Thus, with the above described first embodiment, any overshooting of the output voltage Vccint can be suppressed effectively when the load applied to the voltage output terminal of the booster circuits is light and hence it is possible to always obtain a desired voltage from the booster circuits in a highly controlled manner.

Figure 8:
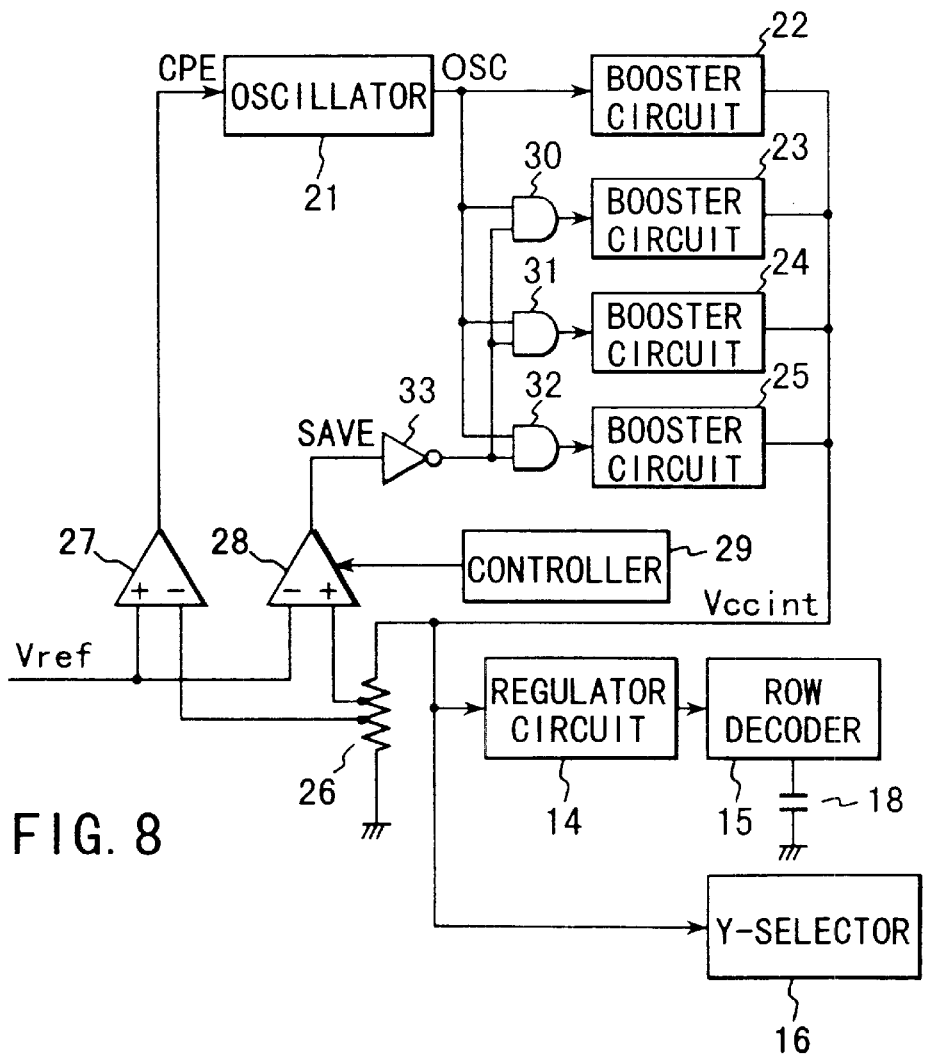
FIG. 8 is a schematic block diagram of a power supply circuit according to a second embodiment of the present invention.

FIG. 8 is a schematic block diagram of a power supply circuit according to a second embodiment of the present invention. Note that the components same as or similar to those of the first embodiment are denoted respectively by the same reference symbols and will not be described any further.

The second embodiment of power supply circuit is implemented by adding a controller 29 to the circuit of the above described first embodiment.

The controller 29 is designed to bring the output signal of operational amplifier 28 up to a high level in the write mode upon receiving a signal typically from a state machine and to bring the output signal to the operational amplifier 28 down to a low level in the erase mode, the write verify mode or the erase verify mode.

The disable terminal of the operational amplifier 28 is supplied with the output signal of the controller 29. The operational amplifier 28 stops operating to output a low level signal SAVE when the output signal of the controller 29 is at a high level. On the other hand, it operates normally when the output signal of the operational amplifier 28 is at a low level.

Otherwise, the second embodiment has a configuration the same as the first embodiment.

The second embodiment operates the same as the first embodiment in the course of raising output voltage Vccint regardless if the load is heavy or light.

More specifically, in the course of raising output voltage Vccint from 0V to 10V, all the booster circuits 22 through 25 operate until the voltage rises from 0V to 10V when the load is heavy as in the write mode.

On the other hand, all the booster circuits 22 through 25 operate until the voltage rises from 0V to 9.5V, for example, to increase the power of the booster circuit when the load is light as in the erase mode, the write mode, the write verify mode or the erase verify mode. Then, only the booster circuit 22 is made to operate to reduce the power of the booster circuits until the output voltage Vccint gets to 10V from 9.5V.

Assume now that the output voltage Vccint is at a level of about 10V initially and the voltage Vccint is made to fall under 10V.

In the write mode, the signal CPE goes to a high level and, since signal SAVE is at a low level, all the booster circuits 22 through 25 are made to operate. In the erase mode, the write verify mode or the read verify mode, both signal CPE and signal SAVE are at a high level and therefore only the booster circuit 22 operates to reduce the power of the booster circuits as a whole. Note that, however, when the output voltage Vccint falls under 9.5V in the erase mode, the write verify mode or the read verify mode, signal SAVE goes to a low level to make all the booster circuits 22 through 25 operate.

Also note that the only requirement for the booster circuits to meet is to make the power of the operating booster circuit(s) equal to a level between one tenth and a half of the combined power of all the booster circuits as described earlier by referring to the first embodiment.

Thus, the second embodiment has the advantage of providing a boosted voltage in a simple but well controlled manner in accordance with the mode of operation in addition to the advantages of the first embodiment.

FIG. 9 is a chart showing exemplary operating voltages of memory cells that can be used in a third embodiment of the present invention.

In order to arrange booster circuits on a limited surface area in a power supply circuit, it is necessary for memory cells to be driven at a low voltage to reduce the electric current flowing to the cells.

In the read mode, a boosted voltage of 5V is typically applied to the control gate in order to provide an electric current sufficient for high speed reading. Channel hot electrons are infused into the floating gate from the drain side to write data.

In the write mode, a voltage of 10V is applied to the control gate while a voltage of 5V is applied to the drain. These voltages are obtained from booster circuits. Note that a large electric current flows to the drain.

In the erase mode, electrons are pulled from the floating gate to the source by F-N tunneling. Under this condition, an inter-band tunnel current flows from the source to the back gate.

The voltage applied to the control gate in the read mode, the voltage applied between the control gate and the drain in the write mode and the voltage applied between the control gate and the source are obtained from booster circuits.

FIG. 10 is a schematic block diagram of a power supply circuit providing the voltages of FIG. 9.

The voltage to be applied to the drain in the write mode, the voltage to be applied to the source in the erase mode and the voltage to be applied to the control gate in the read mode can be supplied from a single booster circuit to reduce the number of booster circuits to three and simplify the configuration of the booster circuit system.

More specifically, as shown in FIG. 10, this embodiment adopts booster circuits of three different types. Intermediate voltage booster circuit 131 provides large electric current between several mA and tens of several mA with an intermediate voltage level of about 5V. High voltage booster circuit 132 provides an electric current between hundreds of several micro amperes and several mA with a high voltage of about 10V. Negative voltage booster circuit 133 provides a negative voltage of about −10V. By way of a switching circuit 134, the intermediate voltage booster circuit 131 is connected to the control gate of memory cell 135 in the read mode, to the drain of the memory cell 135 in the write mode and the source of the memory cell 135 in the erase mode. Also by way of the switching circuit 134, the high voltage booster circuit 132 is connected to the control gate of the memory cell 135 in the write mode. Again, by way of the switching circuit 134, the negative voltage booster circuit 133 is connected to the control gate of the memory cell 135 in the erase mode.

FIG. 11 is a schematic block diagram of a concrete example of the power supply circuit providing the voltages of FIG. 9.

The intermediate voltage booster circuit 131 includes a charge pump circuit 131a having first and second output terminals Vp1 and Vp2 for supplying intermediate voltage VP, a level detector 131b for detecting the level of the first output terminal Vp1 and an oscillator (OSC) 131c adapted to oscillate and provide the charge pump circuit 131a with clock signal Ø1 when the level detector 131b detects a fall in the level of the first output terminal Vp1.

The high voltage booster circuit 132 includes a charge pump circuit 132a having output terminal Vh for supplying high voltage VH, a level detector 132b for detecting the level of the output terminal Vh and an oscillator (OSC) 132c adapted to oscillate and provide the charge pump circuit 132a with clock signal Ø2 when the level detector 132b detects a fall in the level of the output terminal Vh and data read signal /RD (/ denotes an inverted signal) that is at a low level in the read mode rises to a high level. The output terminal Vh of the charge pump circuit 132a is connected to the second output terminal Vp2 of the intermediate voltage booster circuit 131.

With a power supply circuit having the above described configuration, the high voltage booster circuit 132 stops operating in the read mode or in a stand-by state but, since the output terminal Vh is held to the potential of the output terminal Vp2 of the intermediate voltage booster circuit 131, the circuit would never be short of necessary output voltage if the high voltage booster circuit 132 stops operating.

Figure 12:
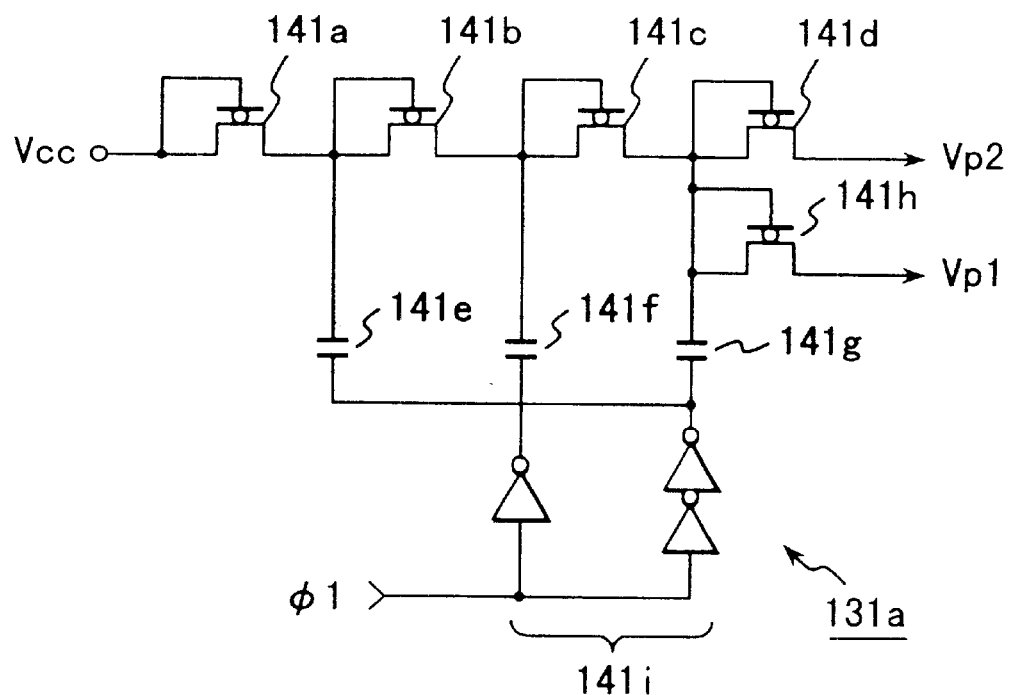
FIG. 12 is a schematic circuit diagram of a concrete example of the first charge pump circuit shown in FIG. 11.

FIG. 12 is a schematic circuit diagram of a concrete example of the first charge pump circuit 131 a shown in FIG. 11.

In the charge pump circuit 13a, a plurality of diode-connected transistors 141a through 141d are serially connected between power supply Vcc and the second output terminal Vp2. Each of the connection nodes of the transistors are connected to corresponding ends of capacitors 141e through 141g respectively. A diode connected transistor 141h is connected between the connection node of the capacitor 141g and the transistor 141d and the first output terminal Vp1. The transistors 141a through 141d and transistor 141h are intrinsic type (I-type) n-channel MOS transistors having a threshold voltage of about 0V.

Buffer circuit 141i feeds the other ends of the capacitors 141e through 141g with clock signal Ø1 generated by the oscillator 131c. Thus, as clock signal Ø1 generated by the oscillator 131c is sent to the capacitors by way of buffers 141i and the electric charge is transferred further on as the capacitors are pumped.

Figure 13:
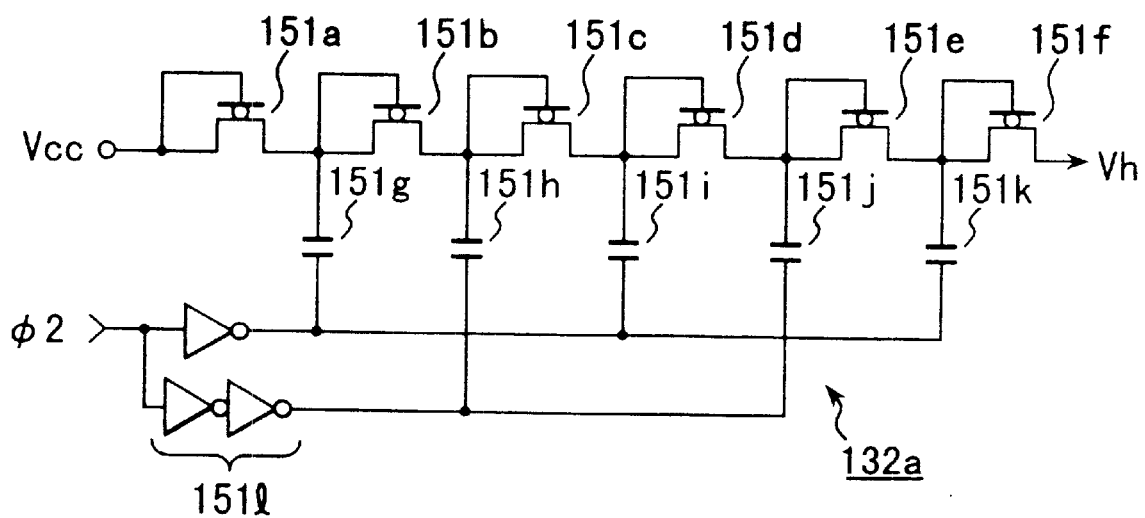
FIG. 13 is a schematic circuit diagram of a concrete example of the second charge pump circuit shown in FIG. 11.

FIG. 13 is a schematic circuit diagram of a concrete example of the second charge pump circuit 132a shown in FIG. 11.

In the charge pump circuit 132a, a plurality of diode-connected transistors 151a through 151f are connected serially between power supply Vcc and the output terminal Vh. The transistors 151a through 151f are I-type n-channel MOS transistors having a threshold voltage substantially equal to 0V. The connection nodes of the transistors are connected to corresponding ends of capacitors 151g through 151k respectively.

Buffer circuit 151l feeds the other ends of the capacitors 151g through 151k with clock signal Ø2 generated by the oscillator 132c. Thus, as clock signal Ø2 generated by the oscillator 132c is sent to the capacitors by way of buffers 151l and the electric charge is transferred firer on as the capacitors are pumped.

Figure 14:
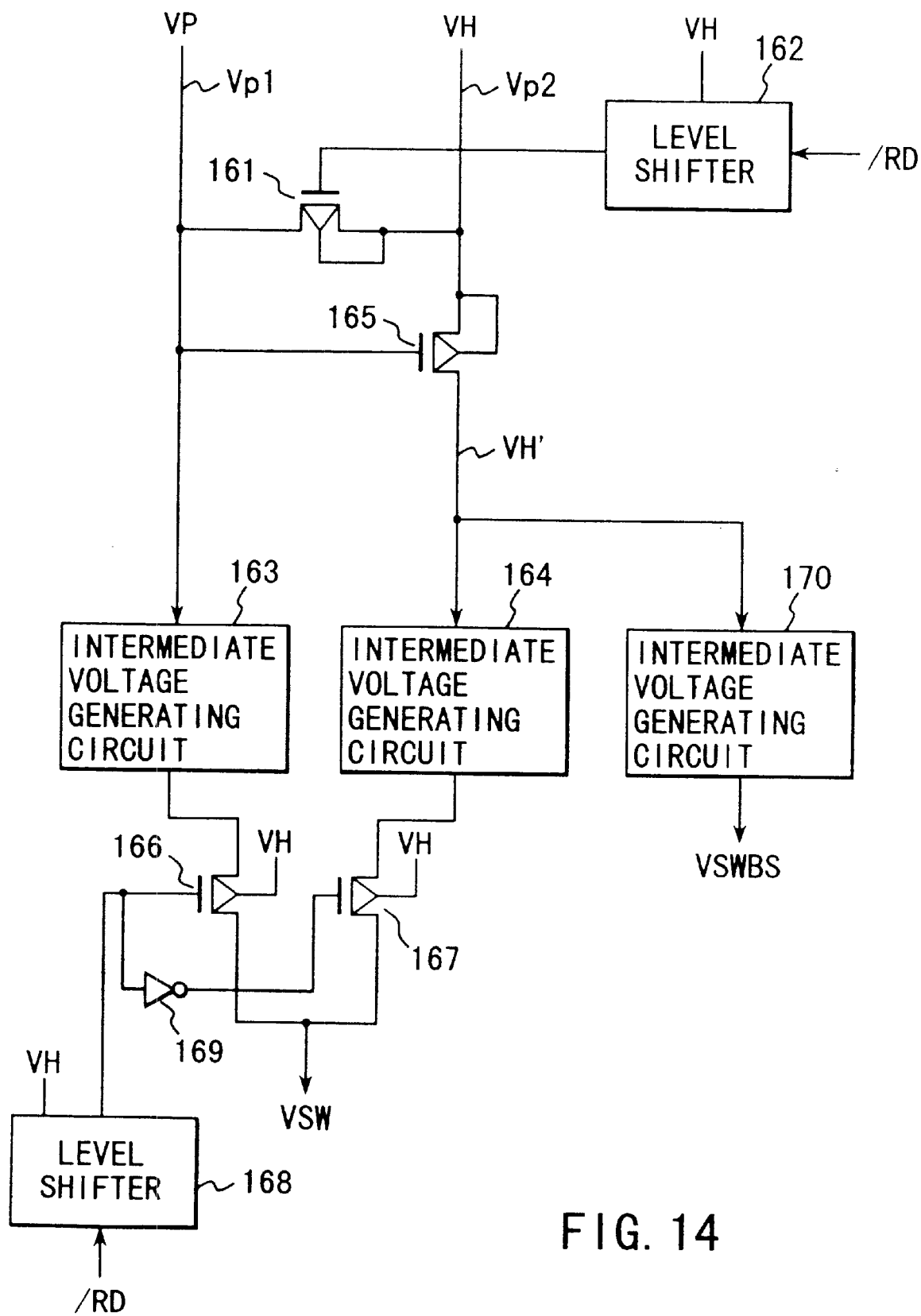
FIG. 14 is a schematic block diagram of a regulator circuit for generating voltage VSW and voltage VSWBS on the basis of intermediate voltage VP and high voltage VH obtained from the intermediate voltage booster circuit and the high voltage booster circuit of FIG. 11 respectively.

FIG. 14 is a schematic block diagram of a regulator circuit for generating voltage VSW and voltage VSWBS on the basis of intermediate voltage VP and high voltage VH obtained from the intermediate voltage booster circuit 131 and the high voltage booster circuit 132 of FIG. 11 respectively. Note that voltage VSW is used for word lines and voltage VSWBS is used to generate a drain voltage in the write mode and a source voltage in the erase mode.

A p-channel transistor 161 is connected between the first and second output terminals Vp1, Vp2 (Vh). Data read signal /RD is applied to the gate of the p-channel transistor 161 by way of a level shifter 162. The level shifter 162 shifts the voltage of its input signal to the level of high voltage VH. While a p-channel transistor 161 and a level shifter 162 are arranged in FIG. 14, they may alternatively be arranged in the power supply circuit of FIG. 11.

The first output terminal Vp1 is connected to first intermediate voltage generating circuit 163 for generating the word line voltage in the read mode. The second output terminal Vp2 is connected to second intermediate voltage generating circuit 164 for generating the word line voltage in the write mode by way of a p-channel transistor 165. The back gate of the p-channel transistor 165 is connected to the second output terminal Vp2 and the gate of the transistor 165 is connected to the first output terminal Vp1.

The output terminals of the first and second intermediate voltage generating circuits 163, 164 are connected respectively to the sources of p-channel transistors 166 and 167. The gate of the transistor 166 is applied with data read signal /RD by way of a level shifter 168, while the gate of the transistor 167 is applied with the output signal of the level shifter 168 inverted by inverter 169. The level shifter 168 shifts the voltage of the input signal to the level of high voltage VH. The drains of the transistors 166, 167 are connected to each other and generate voltage VSW for word lines. The back gates of the p-channel transistors 166, 167 are applied with high voltage VH.

The connection point (high voltage VH) of the p-channel transistor 165 and the second intermediate voltage generating circuit 164 is connected to a third intermediate voltage generating circuit 170 for generating voltage VSWBS that is used to generate a drain voltage in the write mode and a source voltage in the erase mode.

Since the output terminal Vh of the high voltage booster circuit 132 is connected to the second output terminal Vp2 of the intermediate voltage output booster circuit 131 in FIG. 11 as described above, the output terminal Vh is held to the potential of the second output terminal Vp2 of the intermediate voltage booster circuit 131 if the high voltage booster circuit 132 is deactivated in the read mode. Therefore, the power supply circuit would never be short of necessary output voltage if the high voltage booster circuit 132 stops operating.

In the read mode or in a stand-by state, signal /RD goes to a low level and hence the high voltage booster circuit 132 does not operate. Under this condition, the p-channel transistor 161 of FIG. 14 connected between the first and second output terminals Vp1 and Vp2 is turned on to make voltages VP and VH equal to each other. In a mode other than the read mode or a stand-by state, the high voltage booster circuit 132 is activated to turn off the p-channel transistor 161. Then, voltage VP is made lower than voltage VH.

While transfer gates for controlling the potentials of the first and second output terminals Vp1, Vp2 in the above described manner can be easily implemented by using depletion type transistors, such a gate inevitably increases the number of steps for manufacturing the overall circuit. In view of this problem, the transfer gates of this embodiment are implemented without using depletion type transistors as shown in FIG. 14.

Referring to the regulator circuit of FIG. 14, the p-channel transistor 166 is turned on while the p-channel transistor 167 is turned off in the read mode so that the first intermediate voltage generating circuit 163 lowers voltage VP to generate voltage VSW for word lines, whereas the p-channel transistor 167 is turned on while the p-channel transistor 166 is turned off in the write mode and the verify mode so that the second intermediate voltage generating circuit 164 lowers voltage VH to generate voltage VSW for word lines.

Since the back gate bias voltage of the p-channel transistor 161 is equal to voltage VH, voltage VH should always be higher than voltage VP. However, if voltage VSW is raised from a low level, for example the voltage level of 3.5V in the erase verify mode, when signal /RD is at a low level, voltage VH will fall to about 3.5V because of the large parasitic capacitance of the word lines. The transistor 165 prevents this voltage fall from taking place. It makes voltage VH fall only to the level of voltage VP plus the threshold voltage of the p-channel transistor.

Figure 15:
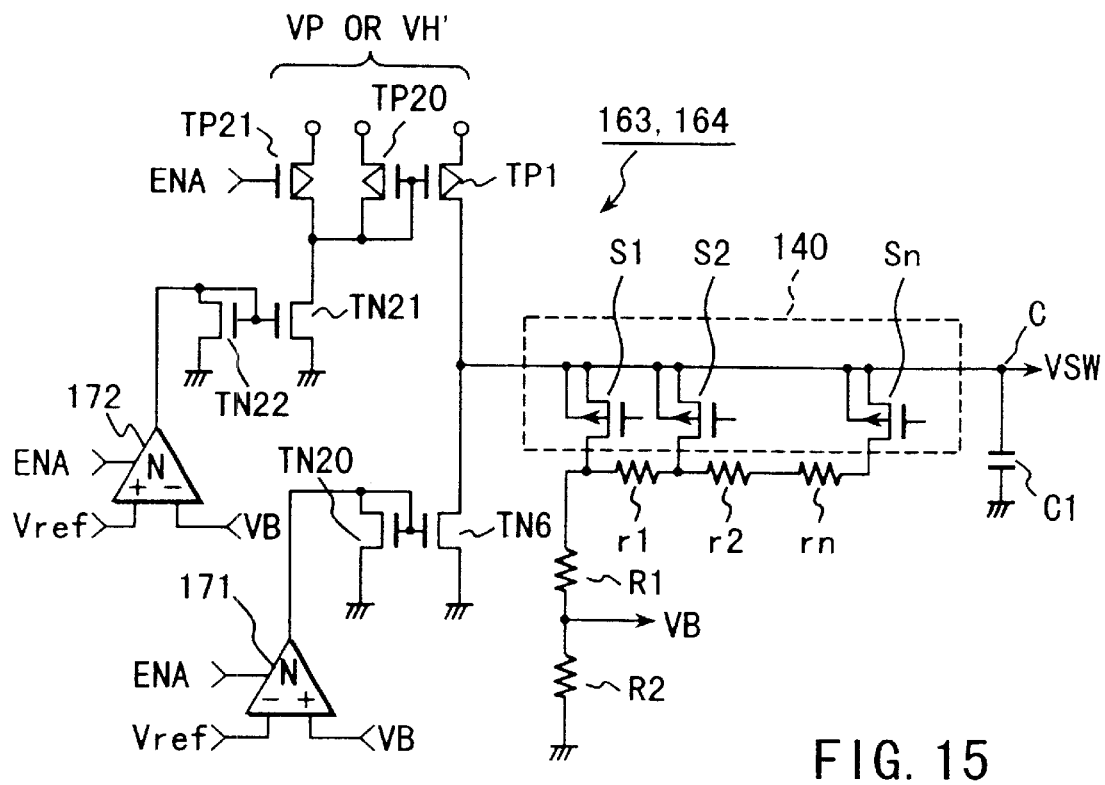
FIG. 15 is a schematic circuit diagram of a concrete example of each of the first and second intermediate voltage generating circuits shown in FIG. 14.

FIG. 15 is a schematic circuit diagram of a concrete example of each of the first and second intermediate voltage generating circuits shown in FIG. 14.

The circuit of FIG. 15 includes p-channel transistors TP21, TP20 and TP1 that are supplied with either voltage VP or voltage VH', comparators 171, 172 for comparing reference voltage Vref and output detecting voltage VB, n-channel transistors TN20, TN6, TN21 and TN22 for controlling the p-channel transistors TP21, TP20 and TP1 in accordance with the outputs of the comparators 171, 172, a resistance dividing circuit 140 formed by p-channel transistors S1, S2, ..., Sn for controlling the output voltage and a plurality of serially connected resistors r1, r2, ..., rn and an output stabilizing capacitor C1. In this circuit, the resistance dividing circuit 140 formed by a plurality of p-channel transistors S1, S2, ..., Sn is used to provide required voltage VSW.

Figure 16:
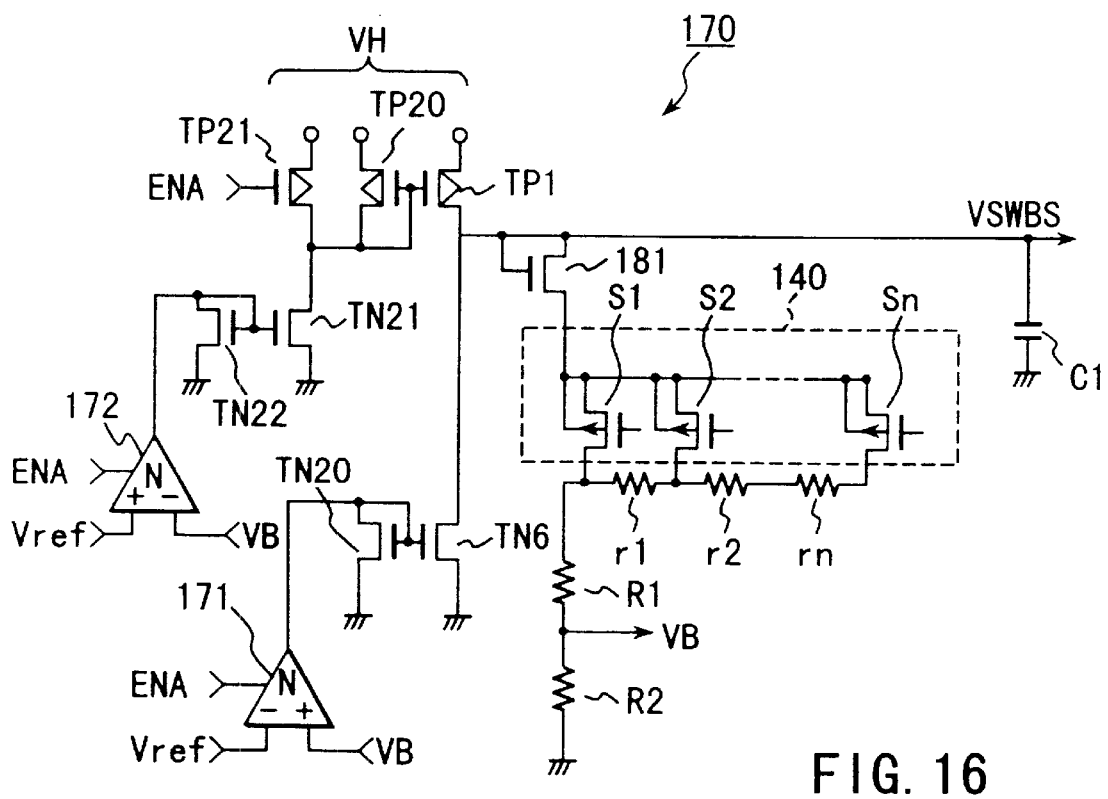
FIG. 16 is a schematic circuit diagram of a concrete example of the third intermediate voltage generating circuit shown in FIG. 14.

FIG. 16 is a schematic circuit diagram of a concrete example of the third intermediate voltage generating circuit 170 shown in FIG. 14. In FIG. 16, the components which are the same as those of FIG. 15 are denoted respectively by the same reference symbols and will not be described any further.

The circuit of FIG. 16 differs from that of FIG. 15 in that an n-channel transistor 181 having the drain and the gate connected with each other is connected between the source of the p-channel transistor S1 and the output terminal of the circuit. Thus, the circuit generates voltage VSWBW necessary for canceling the threshold voltages of source follower transistors 194, 200 in the circuit of FIG. 17, which will be described hereinafter.

Figure 17:
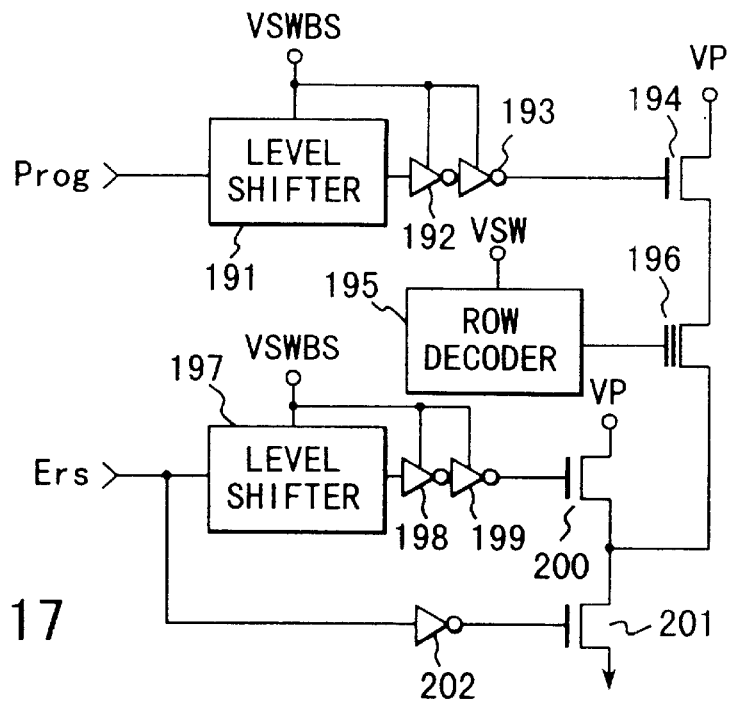
FIG. 17 is a schematic block diagram of a circuit for generating a drain voltage in the write mode and a source voltage in the erase mode for memory cells on the basis of voltage VSWBS generated by the regulator circuit shown in FIG. 14.

FIG. 17 is a schematic block diagram of a circuit for generating a drain voltage in the write mode and a source voltage in the erase mode for memory cells on the basis of voltage VSWBS generated by the regulator circuit shown in FIG. 14. Note that there are also shown a row decoder 195 that uses voltage VSW and a memory cell 196 that is supplied with the voltage.

Write control signal Prog is applied to the gate of n-channel transistor 194 as a column selector by way of level shifter 191 and inverter circuits 192, 193. The output voltage VSWBS of the third intermediate voltage generating circuit 170 is supplied to the level shifter 191 and the inverter circuits 192, 193 and a signal having a voltage level of VSWBS is applied to the gate of the n-channel transistor 194. Voltage VP is applied to the drain of the transistor 194 and the source of the transistor is connected to the drain of the memory cell 196.

Erase signal Ers is applied to the gate of n-channel transistor 200 by way of level shifter 197 and inverter circuits 198, 199. The output voltage VSWBS of the third intermediate voltage generating circuit 170 is supplied to the level shifter 197 and the inverter circuits 198, 199 and a signal having a voltage level of VSWBS is applied to the gate of the n-channel transistor 200. Voltage VP is applied to the drain of the transistor 200 and the source of the transistor is connected to the source of the memory cell 196 and grounded by way of n-channel transistor 201. Erase signal Ers is applied to the gate of the transistor 201 by way of inverter circuit 202.

The control gate (word line) of the memory cell 196 is connected to row decoder 195. Output voltage VSW of the first and second intermediate voltage generating circuit 163, 164 is applied to the row decoder 195. The control gate of the memory cell 196 is controlled by voltage VSW.

As described above, each of the source follower n-channel transistors 194, 200 has its gate applied with voltage VSWBS that is higher than voltage VP by the threshold voltage and its drain applied with voltage VP. The n-channel transistors 194, 200 control the drain current of the memory cell 196 in the write mode and its source current in the erase mode. With this arrangement, the threshold voltage is prevented from falling undesiredly.

The drain voltage VP of the n-channel transistors 194, 200 is the output voltage of the intermediate voltage booster circuit 131 constituted by a charge pump circuit having a small number of stages and adapted to a large quantity of electricity and hence can allow a large electric current to flow. On the other hand, since no DC current flows through the gates of the n-channel transistors 194, 200, they can be driven by the output voltage of the high voltage booster circuit 132 constituted by a charge pump circuit having a large number of stages and adapted to a small quantity of electricity. With this arrangement, the booster circuits can be used to selectively apply appropriate voltages to the corresponding transistors to drive them. Note that a voltage regulated by shifting the voltage VP may alternatively be applied to the drains of the n-channel transistors 194, 200.

Figure 18:
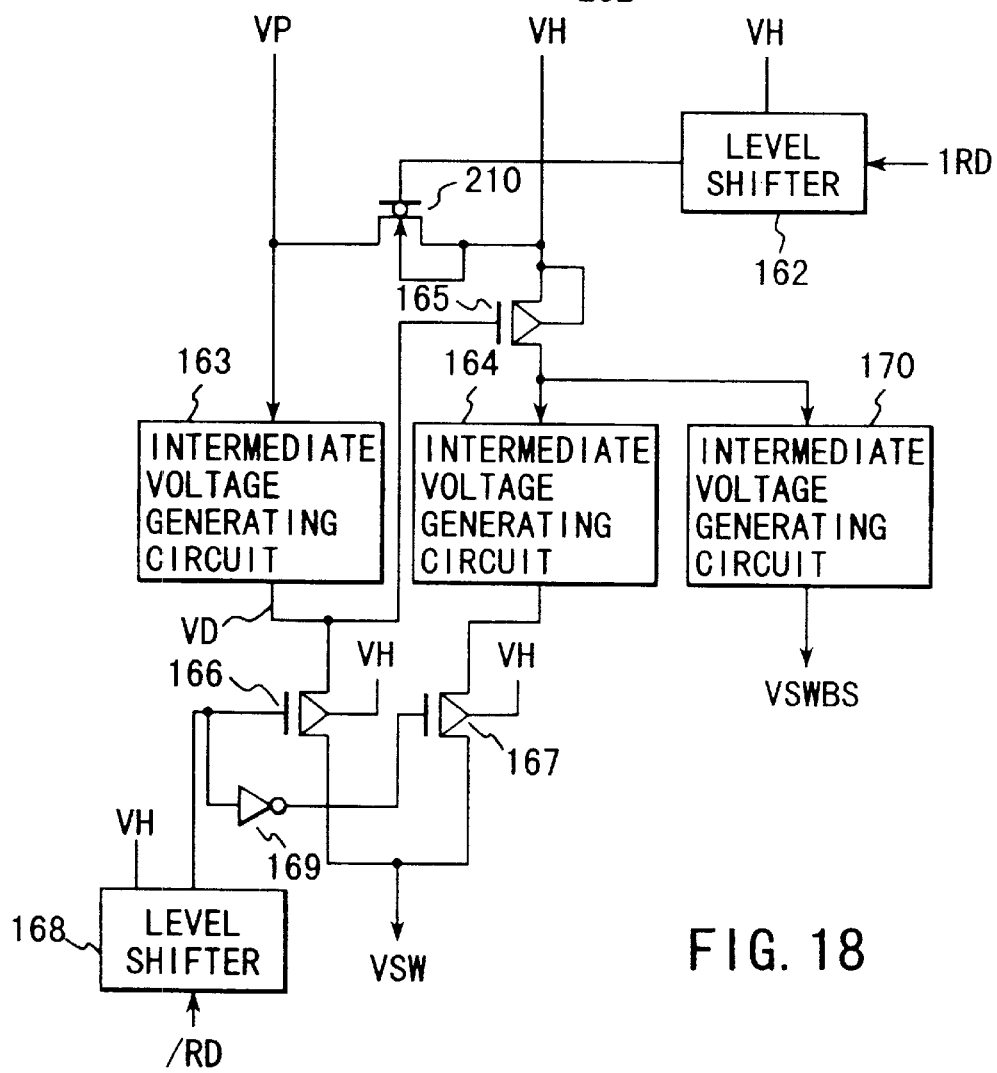
FIG. 18 is a schematic block diagram of a regulator circuit obtained by modifying the circuit of FIG. 14.

FIG. 18 is a schematic block diagram of a regulator circuit obtained by modifying the circuit of FIG. 14. Note that the components which are the same as those of the circuit of FIG. 14 are denoted respectively by the same reference symbols and will not be described any further.

By comparing this modified embodiment with the circuit of FIG. 14, it will be seen that the p-channel transistor 161 is replaced by I-type n-channel MOS transistor 210 having a threshold voltage substantially equal to 0V and the gate of the p-channel transistor 165 is connected to the connection node of the output terminal of the first intermediate voltage generating circuit 163 and the source of the p-channel transistor 166.

Note that, since the output terminal of the second intermediate voltage generating circuit 164 is connected to the p-channel transistor 167 having its back gate applied with voltage VH, the intermediate voltage between the source and the substrate is forwardly biased if the voltage VH falls under the output terminal voltage VD of the first intermediate voltage generating circuit 163. It will be appreciated that, since the voltage VH should not fall under the output terminal voltage VD of the first intermediate voltage generating circuit, any potential fall of the voltage VH is prevented and the transistor 166 is protected by the p-channel transistor 165.

Thus, with the above described third embodiment, a desired voltage can be obtained from the booster circuits without using depletion type transistors to reduce the chip cost.

As described above in detail by way of the first through third embodiments, the present invention provides a power supply circuit adapted to reduce fluctuations in the output voltage that can appear when a light load is applied to the voltage output terminal of the booster circuits and hence make the device driven by the power supply circuit operate reliably. It also provides a semiconductor memory device having such a power supply circuit. Further, the present invention provides a semiconductor memory device in which a desired voltage can be obtained from booster circuits that are implemented without using costly transistors to reduce the chip cost.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a first booster circuit for outputting a first boosted voltage obtained by boosting a power supply voltage;

a second booster circuit for outputting a second boosted voltage higher than said first boosted voltage by boosting the power supply voltage;

a regulator circuit for regulating said second boosted voltage output from said second booster circuit to generate a regulated voltage;

a transistor having a current path with an end applied with a voltage from said first booster circuit in a write or erase mode and the other end connected to an end of a current path of a memory cell; and a circuit for shifting a level of a signal to a gate of said transistor supplied to a level of the regulated voltage output from said regulator circuit.

2. The semiconductor memory device according to claim 1, wherein:

said transistor includes a first transistor having a current path with an end applied with the voltage from said first booster circuit in said write mode and the other end connected to a drain side of the memory cell, and a second transistor having a current path with an end applied with the voltage from said first booster circuit in said erase mode and the other end connected to a source side of the current path of the memory cell; and said circuit shifts levels of a first signal supplied to a gate of said first transistor in said write mode and a second signal supplied to a gate of said second transistor in said erase mode.

3. The semiconductor memory device according to claim 1, wherein said transistor is an n-channel transistor operating as a source follower.

4. The semiconductor memory device according to claim 1, further comprising a voltage generating circuit for generating a write voltage from of said second boosted voltage output from said second booster circuit to supply the write voltage to a control gate of said memory cell in said write mode.

5. The semiconductor memory device according to claim 1, further comprising a negative charge pump circuit for generating a negative voltage from the power supply voltage to supply the negative voltage to a control gate of said memory cell in said erase mode.

* * * * *